US012550756B2

(12) United States Patent
Yue et al.

(10) Patent No.: US 12,550,756 B2
(45) Date of Patent: Feb. 10, 2026

(54) MANUFACTURING METHOD OF DISPLAYING BASE PLATE, DISPLAYING BASE PLATE AND DISPLAYING APPARATUS

(71) Applicant: BOE TECHNOLOGY GROUP CO., LTD., Beijing (CN)

(72) Inventors: Yang Yue, Beijing (CN); Shi Shu, Beijing (CN); Qi Yao, Beijing (CN); Yong Yu, Beijing (CN); Shipei Li, Beijing (CN); Xiang Li, Beijing (CN); Chuanxiang Xu, Beijing (CN); Wenqu Liu, Beijing (CN); Renquan Gu, Beijing (CN); Haitao Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 714 days.

(21) Appl. No.: 17/762,239

(22) PCT Filed: May 24, 2021

(86) PCT No.: PCT/CN2021/095516
§ 371 (c)(1),
(2) Date: Mar. 21, 2022

(87) PCT Pub. No.: WO2022/246602
PCT Pub. Date: Dec. 1, 2022

(65) Prior Publication Data
US 2024/0047363 A1 Feb. 8, 2024

(51) Int. Cl.
*H01L 23/538* (2006.01)
*H01L 21/48* (2006.01)
*H01L 25/075* (2006.01)

(52) U.S. Cl.
CPC ...... *H01L 23/5383* (2013.01); *H01L 21/4857* (2013.01); *H01L 25/0753* (2013.01)

(58) Field of Classification Search
CPC ... H01L 23/538; H01L 23/5383; H01L 21/48; H01L 21/4857; H01L 25/16;
(Continued)

(56) References Cited

U.S. PATENT DOCUMENTS

2019/0018526 A1 1/2019 Fu et al.
2022/0005879 A1 1/2022 Li

FOREIGN PATENT DOCUMENTS

CN 108878444 A 11/2018
CN 110391261 A * 10/2019 ........... H01L 27/156
(Continued)

*Primary Examiner* — Ajay Ojha
(74) *Attorney, Agent, or Firm* — WHDA, LLP

(57) ABSTRACT

A manufacturing method of a displaying base plate, a displaying base plate and a displaying apparatus. The displaying base plate includes an active area and a peripheral area located at a periphery of the active area. The displaying base plate includes: a substrate; a wiring functional layer disposed on one side of the substrate, wherein the wiring functional layer includes a metal wiring and bonding terminals connected to the metal wiring), the bonding terminals include a first bonding terminal, a second bonding terminal and a third bonding terminal, the first bonding terminal and the second bonding terminal are located at the active area, and the third bonding terminal is located at the peripheral area; a first passivation layer disposed on one side of the wiring functional layer that is away from the substrate; and a light shielding layer disposed on one side of the first passivation layer that is away from the substrate.

20 Claims, 13 Drawing Sheets

(58) Field of Classification Search
CPC . H01L 25/167; H01L 25/075; H01L 25/0753; H01L 27/12; H01L 33/62; H01L 33/0066; G09G 3/32
USPC .......................................................... 257/89
See application file for complete search history.

(56) References Cited

FOREIGN PATENT DOCUMENTS

| | | | |
|---|---|---|---|
| CN | 110707130 A | | 1/2020 |
| CN | 111766977 A | | 10/2020 |
| CN | 112310119 A | * | 2/2021 |
| CN | 112599536 A | | 4/2021 |

* cited by examiner

| Type | a | b | c |
|---|---|---|---|
| | Carbon black | Organic black | Organic black |
| OD | 4.0/μm | 2.0/μm | 2.6/μm |
| Designed film thickness | 0.5μm | 1.0μm | 0.77μm |
| Baking temperature | 230°C | 230°C | 85°C |
| Dielectric constant | 15 | 3.7 | 3.5 |
| Resolving power | CD Bias ≈0μm good | CD Bias >9μm poor | CD Bias -5μm medium |

MANUFACTURING METHOD OF DISPLAYING BASE PLATE, DISPLAYING BASE PLATE AND DISPLAYING APPARATUS

TECHNICAL FIELD

The present disclosure relates to the technical field of displaying, and particularly relates to a manufacturing method of a displaying base plate, a displaying base plate and a displaying apparatus.

BACKGROUND

The Micro/Mini light emitting diode (Micro/Mini-LED) displaying technique, as a new generation of displaying technique, has the advantages such as a high brightness, a high luminous efficiency and a low power consumption.

Currently, the metal wirings in LED displaying base plates are manufactured by using metal materials of a high reflectivity and extend throughout the active area. When the ambient light is intensive, those metal wirings have an intensive light reflection, which affects the contrast of the LED displaying base plates.

SUMMARY

The present disclosure provides a displaying base plate, wherein the displaying base plate comprises a active area and a peripheral area located at a periphery of the active area, and the displaying base plate comprises:
   a substrate;
   a wiring functional layer disposed on one side of the substrate, wherein the wiring functional layer comprises a metal wiring and bonding terminals connected to the metal wiring, the bonding terminals include a first bonding terminal, a second bonding terminal and a third bonding terminal, the first bonding terminal is configured for bonding an LED chip, the second bonding terminal is configured for bonding a driving chip, the driving chip is configured for driving the LED chip to emit light, the third bonding terminal is configured for bonding a flexible circuit board, the first bonding terminal and the second bonding terminal are located at the active area, and the third bonding terminal is located at the peripheral area;
   a first passivation layer disposed on one side of the wiring functional layer that is away from the substrate; and
   a light shielding layer disposed on one side of the first passivation layer that is away from the substrate, wherein an orthographic projection of the light shielding layer on the substrate and orthographic projections of the bonding terminals on the substrate do not overlap, and in the active area, the orthographic projection of the light shielding layer on the substrate covers an orthographic projection of the metal wiring on the substrate.

In an optional embodiment, in the active area, the orthographic projection of the light shielding layer on the substrate and the orthographic projections of the metal wirings on the substrate completely coincide.

In an optional embodiment, the wiring functional layer comprises: a first metal layer, an insulating layer and a second metal layer that are disposed in stack, and the first metal layer is disposed closer to the substrate; and
   the metal wiring comprises a first metal wiring located at the first metal layer and a second metal wiring located at the second metal layer, the bonding terminals are located at the second metal layer and are interconnected with the second metal wiring, and the second metal wiring and the first metal wiring are connected by a via hole disposed in the insulating layer.

In an optional embodiment, the second metal layer is a copper layer, a transparent electrode layer is disposed between the first passivation layer and the second metal layer, and an orthographic projection of the transparent electrode layer on the substrate covers an orthographic projection of the third bonding terminal on the substrate.

In an optional embodiment, the second metal layer comprises a copper layer and a copper-nickel-alloy layer disposed on one side of the copper layer that is away from the substrate, and a thickness of the first passivation layer is greater than or equal to 8000 angstroms.

In an optional embodiment, an orthographic projection of the copper-nickel-alloy layer on the substrate covers an orthographic projection of the copper layer on the substrate.

In an optional embodiment, a first planarization layer is disposed on one side of the light shielding layer that is away from the substrate, an orthographic projection of the first planarization layer on the substrate and the orthographic projections of the bonding terminals on the substrate do not overlap, and an orthographic projection of the first passivation layer on the substrate and the orthographic projections of the bonding terminals on the substrate do not overlap.

In an optional embodiment, a material of the light shielding layer is an organic black material.

In an optional embodiment, a second planarization layer is disposed between the light shielding layer and the first passivation layer, an orthographic projection of the second planarization layer on the substrate and the orthographic projections of the bonding terminals on the substrate do not overlap, and an orthographic projection of the first passivation layer on the substrate and the orthographic projections of the bonding terminals on the substrate do not overlap.

In an optional embodiment, a second passivation layer is disposed between the light shielding layer and the second planarization layer, and an orthographic projection of the second passivation layer on the substrate and the orthographic projections of the bonding terminals on the substrate do not overlap.

In an optional embodiment, a material of the light shielding layer is a carbon-black material.

In an optional embodiment, the insulating layer comprises a third passivation layer, a third planarization layer and a fourth passivation layer that are disposed in stack on one side of the first metal layer that is away from the substrate, and the third passivation layer is disposed closer to the first metal layer.

In an optional embodiment, an electroplating functional layer is disposed between the substrate and the first metal layer, and an orthographic projection of the electroplating functional layer on the substrate and an orthographic projection of the first metal layer on the substrate completely coincide.

In an optional embodiment, the active area comprises a plurality of pixel units that are arranged in an array, and the first metal wiring comprises:
   at least one first sub-wiring extending in a pixel column direction in the active area, wherein the first sub-wiring has a first line width in a pixel row direction; and
   at least one second sub-wiring extending in the pixel column direction in the active area, wherein the second sub-wiring has a second line width in the pixel row direction, and the second line width is less than the first line width.

In an optional embodiment, a second sub-wiring adjacent to a first sub-wiring in the pixel row direction and the first sub-wiring have a first spacing therebetween, wherein the first spacing is greater than three times the first line width.

In an optional embodiment, an orthographic projection of the first bonding terminal on the substrate is located in an area of an orthographic projection of the first sub-wiring on the substrate.

The present disclosure provides a displaying apparatus, wherein the displaying apparatus comprises the displaying base plate according to any one of the above items.

The present disclosure provides a manufacturing method of a displaying base plate, wherein the displaying base plate comprises a active area and a peripheral area located at a periphery of the active area, and the manufacturing method comprises:

providing a substrate;
forming a wiring functional layer at one side of the substrate, wherein the wiring functional layer comprises a metal wiring and bonding terminals connected to the metal wiring, the bonding terminals include a first bonding terminal, a second bonding terminal and a third bonding terminal, the first bonding terminal is for bonding an LED chip, the second bonding terminal is for bonding a driving chip, the driving chip is for driving the LED chip to emit light, the third bonding terminal is for bonding a flexible circuit board, the first bonding terminal and the second bonding terminal are located at the active area, and the third bonding terminal is located at the peripheral area; and
forming sequentially a first passivation layer and a light shielding layer on one side of the wiring functional layer that is away from the substrate, wherein an orthographic projection of the light shielding layer on the substrate and orthographic projections of the bonding terminals on the substrate do not overlap, and in the active area, the orthographic projection of the light shielding layer on the substrate covers an orthographic projection of the metal wiring on the substrate.

In an optional embodiment, the step of forming sequentially the first passivation layer and the light shielding layer on the one side of the wiring functional layer that is away from the substrate comprises:

forming a passivating-material thin film on one side of the wiring functional layer that is away from the substrate;
by using a first patterning process, forming the light shielding layer on one side of the passivating-material thin film that is away from the substrate;
by using a second patterning process, forming a first planarization layer on one side of the light shielding layer that is away from the substrate, wherein an orthographic projection of the first planarization layer on the substrate and the orthographic projections of the bonding terminals on the substrate do not overlap; and
by using the first planarization layer as a mask, etching the passivating-material thin film, to form the first passivation layer, wherein an orthographic projection of the first passivation layer on the substrate and the orthographic projections of the bonding terminals on the substrate do not overlap.

In an optional embodiment, the step of forming sequentially the first passivation layer and the light shielding layer on the one side of the wiring functional layer that is away from the substrate comprises:

forming a passivating-material thin film on one side of the wiring functional layer that is away from the substrate;
by using a third patterning process, forming a second planarization layer on one side of the passivating-material thin film that is away from the substrate, wherein an orthographic projection of the second planarization layer on the substrate and the orthographic projections of the bonding terminals on the substrate do not overlap;
by using a fourth patterning process, forming the light shielding layer on one side of the second planarization layer that is away from the substrate; and
by using the second planarization layer as a mask, etching the passivating-material thin film, to form the first passivation layer, wherein an orthographic projection of the first passivation layer on the substrate and the orthographic projections of the bonding terminals on the substrate do not overlap.

In an optional embodiment, before the step of forming the light shielding layer on the one side of the second planarization layer that is away from the substrate, the method further comprises:

by using a fifth patterning process, forming a second passivation layer on one side of the second planarization layer that is away from the substrate, wherein an orthographic projection of the second passivation layer on the substrate and the orthographic projections of the bonding terminals on the substrate do not overlap; and
the step of forming the light shielding layer on the one side of the second planarization layer that is away from the substrate comprises:
forming the light shielding layer on one side of the second passivation layer that is away from the substrate.

In an optional embodiment, the step of forming the wiring functional layer on the one side of the substrate comprises:

forming sequentially a first metal layer, a third passivation layer, a third planarization layer, a fourth passivation layer and a second metal layer on one side of the substrate, wherein the metal wiring comprises a first metal wiring located at the first metal layer and a second metal wiring located at the second metal layer, the bonding terminals are located at the second metal layer and are interconnected with the second metal wiring, and the second metal wiring and the first metal wiring are connected by a via hole disposed in the insulating layer; and
the third planarization layer is formed by:
by using a sixth patterning process, forming a fourth planarization layer on one side of the third passivation layer that is away from the substrate; and
by using a seventh patterning process, forming a fifth planarization layer on one side of the fourth planarization layer that is away from the substrate, wherein the fourth planarization layer and the fifth planarization layer form the third planarization layer.

The above description is merely a summary of the technical solutions of the present disclosure. In order to more clearly know the elements of the present disclosure to enable the embodiment according to the contents of the description, and in order to make the above and other purposes, features and advantages of the present disclosure more apparent and understandable, the particular embodiments of the present disclosure are disposed below.

BRIEF DESCRIPTION OF THE DRAWINGS

In order to more clearly illustrate the technical solutions of the embodiments of the present disclosure or the related art, the figures that are required to describe the embodiments or the related art may be briefly introduced below. Apparently, the figures that are described below are embodiments of the present disclosure, and a person skilled in the art may obtain other figures according to these figures without paying creative work. It should be noted that the proportions in the drawings are merely illustrative and do not indicate the actual proportions.

DETAILED DESCRIPTION OF THE EMBODIMENTS

In order to make the objects, the technical solutions and the advantages of the embodiments of the present disclosure clearer, the technical solutions of the embodiments of the present disclosure may be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall in the protection scope of the present disclosure.

Figure 1:
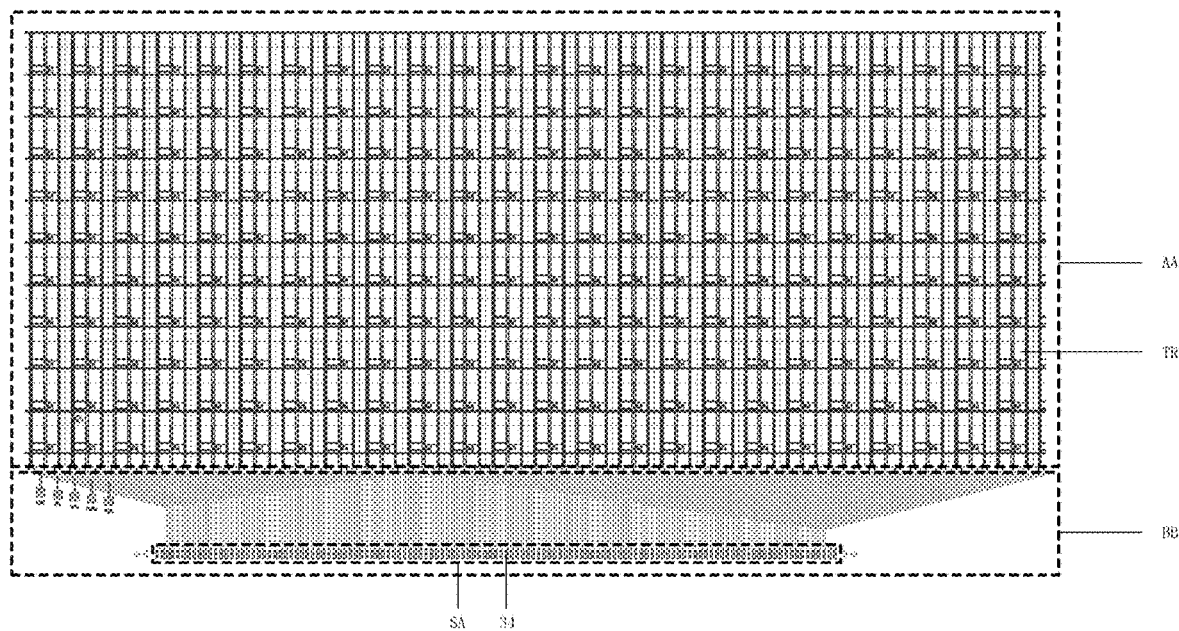
FIG. 1 shows a schematic planar structural diagram of the displaying base plate according to an embodiment of the present disclosure.

An embodiment of the present disclosure provides a displaying base plate. Referring to FIG. 1, FIG. 1 shows a schematic planar structural diagram of the displaying base plate according to the present embodiment. The displaying base plate includes an active area AA and a peripheral area BB located at the periphery of the active area AA.

Figure 2:
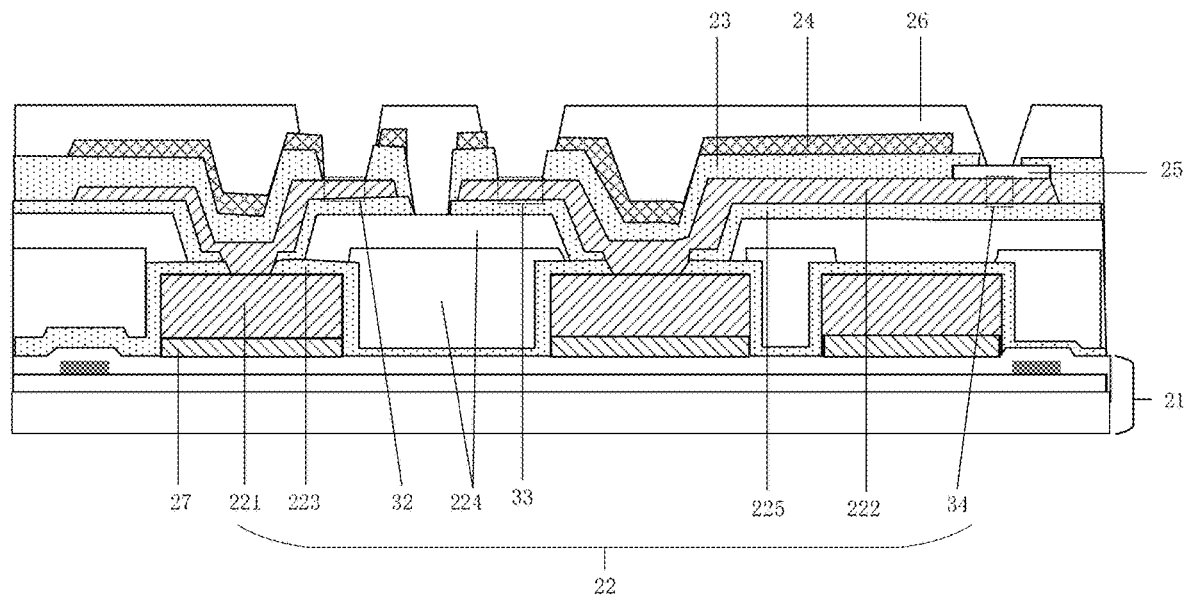
FIG. 2 shows a schematic sectional structural diagram of the first displaying base plate according to an embodiment of the present disclosure.
Figure 7:
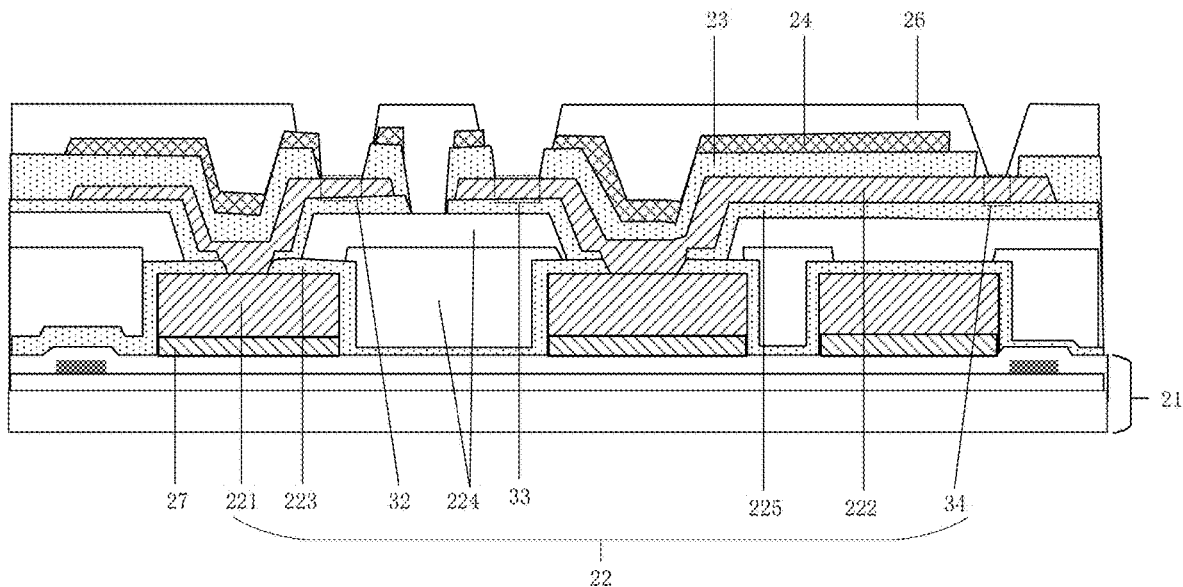
FIG. 7 shows a schematic sectional structural diagram of the second displaying base plate according to an embodiment of the present disclosure.
Figures 9, 10:
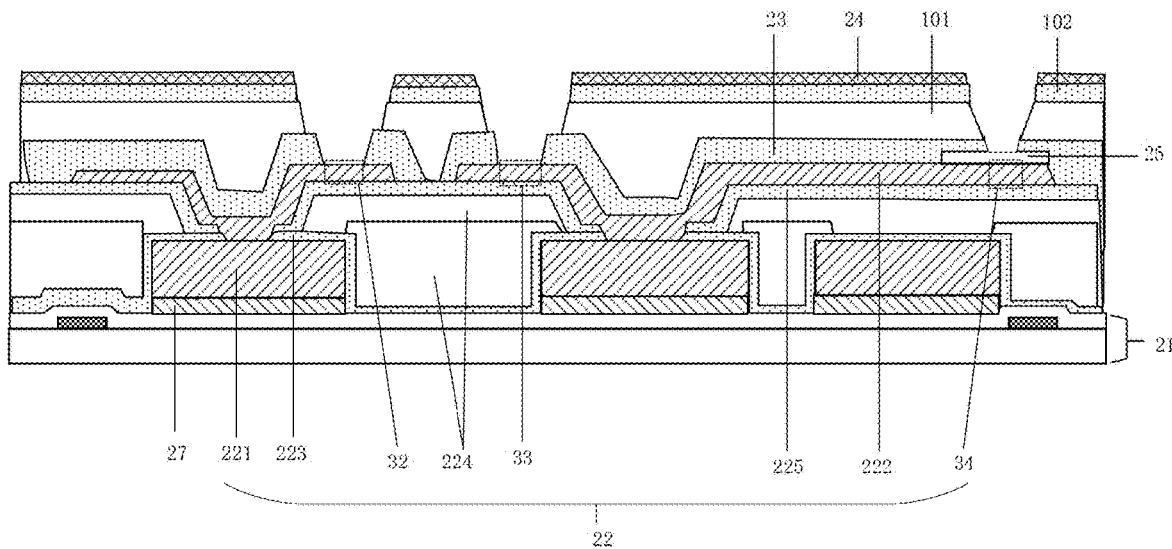
FIG. 9 shows comparison between the parameters of several materials of the light shielding layer according to an embodiment of the present disclosure.
FIG. 10 shows a schematic sectional structural diagram of the third displaying base plate according to an embodiment of the present disclosure.

Referring to FIGS. 2, 7 and 10, FIGS. 2, 7 and 10 show schematic sectional structural diagrams of several displaying base plates according to the present embodiment. The displaying base plate includes: a substrate 21; a wiring functional layer 22 disposed on one side of the substrate 21; a first passivation layer 23 disposed on the one side of the wiring functional layer 22 that is away from the substrate 21; and a light shielding layer 24 disposed on the one side of the first passivation layer 23 that is away from the substrate 21.

Figure 3:
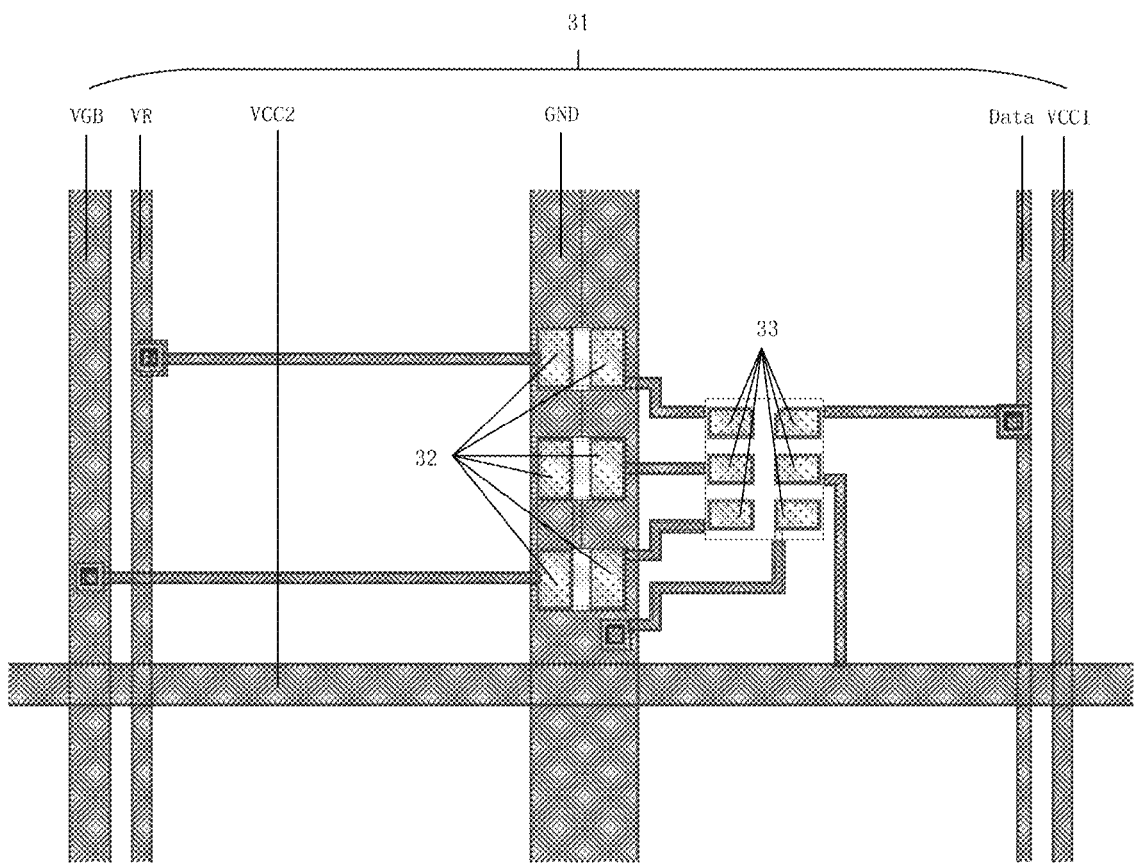
FIG. 3 shows a schematic planar structural diagram of the wiring functional layer according to an embodiment of the present disclosure.

Referring to FIG. 3, FIG. 3 shows a schematic planar structural diagram of a wiring functional layer. The wiring functional layer 22 includes a metal wiring 31 and bonding terminals connected to the metal wiring 31, the bonding terminals include a first bonding terminal 32, a second bonding terminal 33 and a third bonding terminal 34 (as shown in FIG. 1), the first bonding terminal 32 is configured for bonding an LED chip, the second bonding terminal 33 is configured for bonding a driving chip, the driving chip is configured for driving the LED chip to emit light, the third bonding terminal 34 is configured for bonding a flexible circuit board, the first bonding terminal 32 and the second bonding terminal 33 are located at the active area AA, and the third bonding terminal 34 is located at the peripheral area BB.

Figure 4:
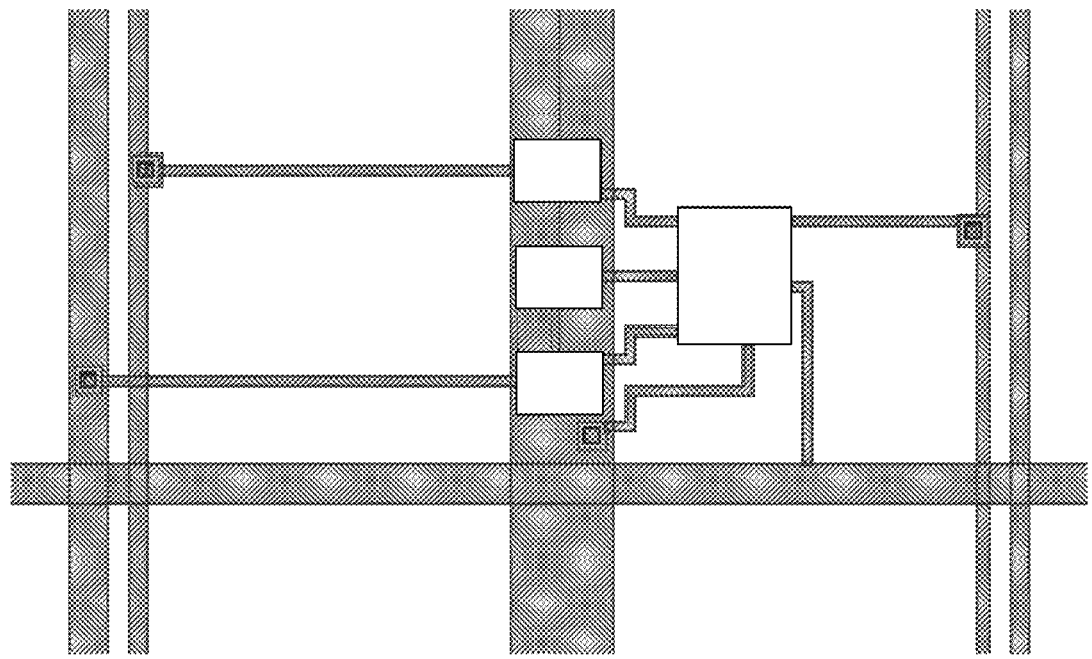
FIG. 4 shows a schematic planar structural diagram of the light shielding layer according to an embodiment of the present disclosure.

Referring to FIG. 4, FIG. 4 shows a schematic planar structural diagram of a light shielding layer. Referring to FIGS. 3 and 4, the orthographic projection of the light shielding layer 24 on the substrate 21 and the orthographic projections of the bonding terminals on the substrate 21 do not overlap, and in the active area AA, the orthographic projection of the light shielding layer 24 on the substrate 21 covers the orthographic projection of the metal wiring 31 on the substrate 21.

Referring to FIGS. 2 to 4, the light shielding layer 24 is disposed with opening areas at the positions corresponding to the first bonding terminal 32, the second bonding terminal 33 and the third bonding terminal 34, which facilitates the subsequent bonding process.

Figure 5:
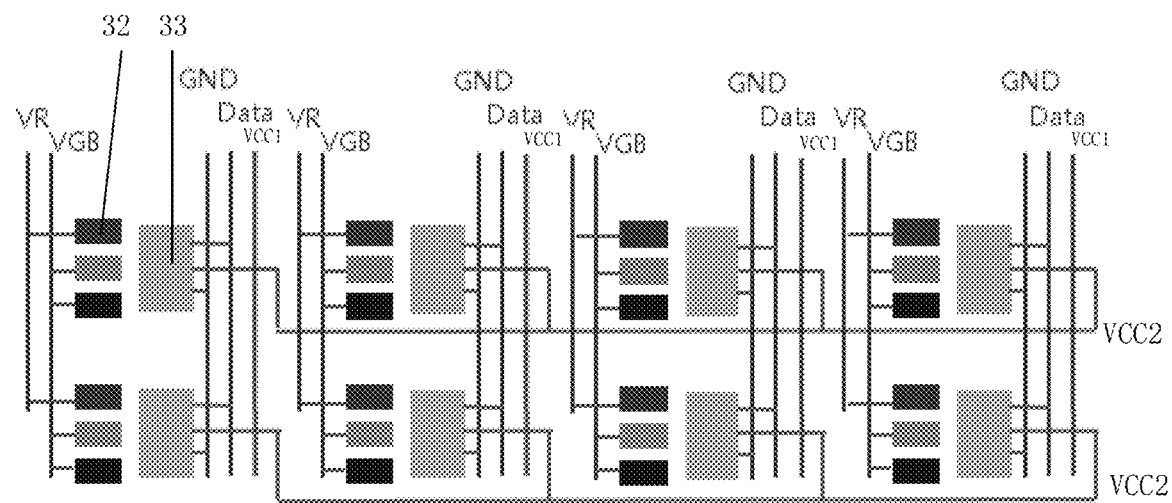
FIG. 5 shows a schematic diagram of the connection structure of the wiring functional layer according to an embodiment of the present disclosure.

Referring to FIG. 1, the active area AA may include a plurality of pixel units, and each of the pixel units may be divided into a transparent area TR and a non-transparent area. The first bonding terminal 32 and the second bonding terminal 33 may be located in the non-transparent areas of the pixel units, as shown in FIGS. 3 and 5. FIG. 3 shows a schematic planar structural diagram of the wiring functional layer in one pixel unit. FIG. 5 shows a schematic diagram of the connection structure between the wiring functional layers corresponding to a plurality of pixel units.

Referring to FIG. 3, the first bonding terminal 32 may be a plurality of first bonding terminals. For example, the plurality of first bonding terminals may include a red-light LED-chip positive terminal, a red-light LED-chip negative terminal, a green-light LED-chip positive terminal, a green-light LED-chip negative terminal, a blue-light LED-chip positive terminal and a blue-light LED-chip negative terminal.

As shown in FIGS. 3 and 5, the metal wiring 31 may include a scanning-signal supply line VCC1, a data-signal line Data, a reference-signal line GND, a first voltage-signal line VGB, a second voltage-signal line VR, a scanning-signal line VCC2 and so on.

It should be noted that, as shown in FIG. 5, in the metal wiring 31, at least one scanning-signal line VCC2 and at least one scanning-signal supply line VCC1 are electrically connected, whereby the scanning-signal supply line VCC1 may transmit the scanning signal received from a flexible circuit board to the scanning-signal line VCC2 of the corresponding row connected thereto. FIG. 5 merely illustrates an optional mode for the disposing of the metal wiring 31, and the positions of connection between the different wirings therein are not limited in the present embodiment.

Referring to FIG. 1, the peripheral area BB may include a bonding-pad area SA and a fanning-out area located between the bonding-pad area SA and the active area AA. The third bonding terminal 34 is located in the bonding-pad area SA.

In the present embodiment, the substrate 21 may include a substrate such as a glass substrate and a flexible substrate, the substrate may further include a matching mark disposed on one side of the substrate, and the substrate may further include a film layer such as a buffer layer, which is not limited in the present embodiment.

The wiring functional layer 22 may be of a single-layer structure, and may also be of a multilayer structure. For example, the wiring functional layer 22 may include multiple metal layers and insulating layers disposed between two adjacent metal layers. The particular layer structure of the wiring functional layer 22 is not limited in the present embodiment. A structure of the wiring functional layer 22 may be introduced in detail in the subsequent embodiments.

The material of the first passivation layer 23 may include inorganic materials such as silicon oxide and silicon nitride, which is not limited in the present embodiment. The first passivation layer 23 may prevent oxidation of the metal wiring 31 in the wiring functional layer 22, to ensure the performance stability of the displaying base plate, and may also prevent residue of the light shielding layer 24 on the surface of the wiring functional layer 22.

The material of the light shielding layer 24 may be a carbon-black material or an inorganic black material, which is not limited in the present embodiment.

In the present embodiment, the LED-chip is an active light emitting device. By using the driving chip to drive the LED chip to emit light, a displaying base plate of a large size may be manufactured, and a large driving current may be implemented.

In the displaying base plate according to the present embodiment, by disposing the light shielding layer 24 on the one side of the wiring functional layer 22 that is away from the substrate 21, wherein the orthographic projection of the light shielding layer 24 on the substrate 21 covers the orthographic projection of the metal wiring 31 on the substrate 21, the reflection of the light ray by the metal wiring 31 is prevented, which increases the contrast of the displaying apparatus.

In order to increase the light transmittance of the active area AA, in an optional embodiment, in the active area AA, the orthographic projection of the light shielding layer 24 on the substrate 21 and the orthographic projection of the metal wiring 31 on the substrate 21 may completely coincide. That is, the light shielding layer 24 may not only cover the metal wiring 31, to prevent the metal wiring 31 from reflecting the ambient light, but also may increase the area of the transparent area TR, thereby increasing the light transmittance of the active area AA.

In an optional embodiment, the substrate 21 may be a flexible base plate, and a bendable area is disposed between the active area AA and the bonding-pad area SA. That is, the peripheral area BB may be bent to the back of the active area AA, and when a plurality of displaying base plates are spliced to be used as a display panel, due to the peripheral areas BB are located at the back of the displaying base plates, the gaps between the adjacent displaying base plates may be reduced, which may improve the overall effect of displaying of the display panel.

In a particular application, if the peripheral area BB is located at the back of the active area AA, or is bendable to the back of the active area AA, the orthographic projection of the light shielding layer 24 on the substrate 21 may not overlap with the peripheral area BB. If the peripheral area BB is located at the front of the active area AA, or is not bendable to the back of the active area AA, in the peripheral area BB, the orthographic projection of the light shielding layer 24 on the substrate 21 may cover the orthographic projection of the metal wiring 31 on the substrate 21.

In an optional embodiment, referring to FIGS. 2, 7 and 10, the wiring functional layer 22 may include: a first metal layer 221, an insulating layer and a second metal layer 222 that are disposed in stack, and the first metal layer 221 is disposed close to the substrate 21.

Figure 6:
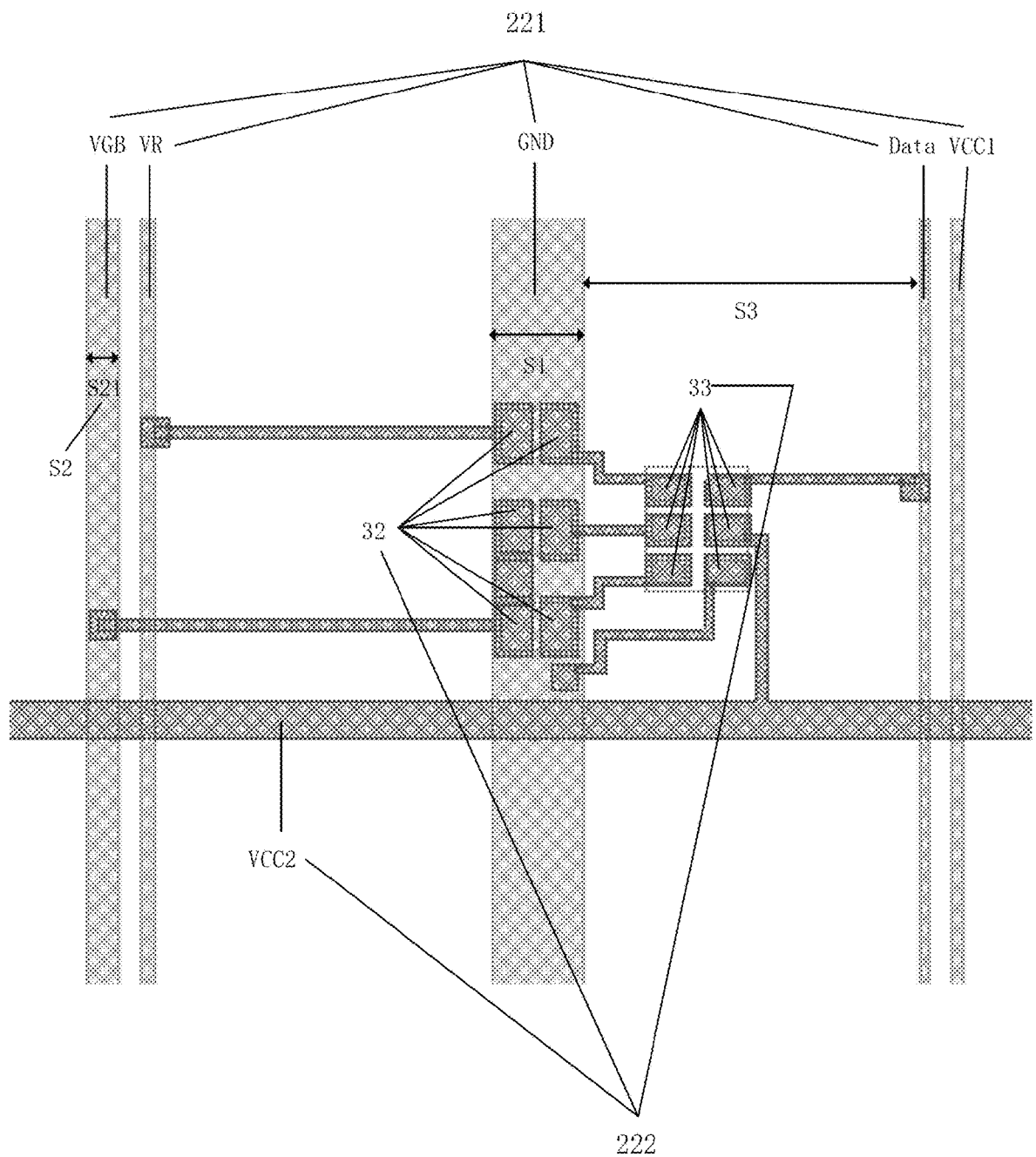
FIG. 6 shows a schematic planar structural diagram of the first metal layer and the second metal layer according to an embodiment of the present disclosure.

In the present embodiment, referring to FIG. 6, the metal wiring 31 may include a first metal wiring located at the first metal layer 221 and a second metal wiring located at the second metal layer 222, the bonding terminals are located at the second metal layer 222 and are interconnected with the second metal wiring, and the second metal wiring and the first metal wiring are connected by a via hole disposed in the insulating layer.

In an optional embodiment, the active area AA includes a plurality of pixel units that are arranged in an array. Referring to FIG. 6, the first metal wiring may include: at least one first sub-wiring (for example, the reference-signal line GND) extending in a pixel column direction in the active area AA, wherein the first sub-wiring has a first line width S1 in a pixel row direction.

The pixel column direction is the column direction of the pixel units that are arranged in an array, and the pixel row direction is the row direction of the pixel units that are arranged in an array.

Referring to FIG. 6, the first metal wiring may further include: at least one second sub-wiring extending in the pixel column direction in the active area AA (such as the first voltage-signal line VGB, the second voltage-signal line VR, the data-signal line Data and the scanning-signal supply line VCC1), wherein the second sub-wiring has a second line width S2 in the pixel row direction, and the second line width S2 is less than the first line width S1. When the second sub-wiring is a plurality of second sub-wirings, the plurality of second sub-wirings may have different second line widths S2 in the pixel row direction (for example, at least one second sub-wiring is included with the line width of S21, at least one second sub-wiring is included with the line width of S22, and at least one second sub-wiring is included with the line width of S2n), but all of those second line widths S2 are less than the first line width S1.

Referring to FIG. 6, a second sub-wiring adjacent to a first sub-wiring (for example, the reference-signal line GND) in the pixel row direction and the first sub-wiring (for example, the reference-signal line GND) are provided with a first spacing S3 therebetween, wherein the first spacing S3 is greater than three times the first line width S1, i.e., S3>3S1.

In some examples, referring to FIG. 6, the orthographic projection of the first bonding terminal 32 on the substrate 21 is located in the area of the orthographic projection of the first sub-wiring (for example, the reference-signal line GND) on the substrate 21.

Referring to FIG. 6, the first metal wiring located at the first metal layer 221 may include: a scanning-signal supply line VCC1, a data-signal line Data, a reference-signal line GND, a first voltage-signal line VGB and a second voltage-signal line VR. The second metal wiring located at the second metal layer 222 may include a scanning-signal line VCC2, and may also include a lead wire for connecting the bonding terminals and the signal lines, and so on. In addition, the first bonding terminal 32, the second bonding terminal 33 and the third bonding terminal 34 may also be located at the second metal layer 222.

The material of the first metal layer 221 may include metal film layers such as a copper layer, a molybdenum layer and an aluminum layer, which is not limited in the present embodiment. The material of the second metal layer 222 may include metal film layers such as a copper layer, a molybdenum layer and an aluminum layer, which is not limited in the present embodiment.

As shown in FIGS. 2, 7 and 10, the insulating layer disposed between the first metal layer 221 and the second metal layer 222 includes a third passivation layer 223, a third planarization layer 224 and a fourth passivation layer 225 that are disposed in stack on the one side of the first metal layer 221 that is away from the substrate 21, and the third passivation layer 223 is disposed close to the first metal layer 221.

The material of the third passivation layer 223 may include inorganic materials such as silicon oxide and silicon nitride, which is not limited in the present embodiment. The material of the fourth passivation layer 225 may include inorganic materials such as silicon oxide and silicon nitride, which is not limited in the present embodiment. The material of the third planarization layer 224 may, for example, be an organic material such as a polyacrylic-acid-type resin, which is not limited in the present embodiment.

By disposing the third passivation layer 223 between the third planarization layer 224 and the first metal layer 221, oxidation of the first metal layer 221 by the oxygen released in the subsequent processes by the third planarization layer 224 may be prevented. By disposing the fourth passivation layer 225 between the third planarization layer 224 and the second metal layer 222, oxidation of the second metal layer 222 by the oxygen released in the subsequent processes by the third planarization layer 224 may be prevented.

In an optional embodiment, as shown in FIGS. 2 and 10, the second metal layer 222 may be a copper layer. In order to prevent oxidation of the third bonding terminal 34 of the peripheral area BB, a transparent electrode layer 25 may be disposed between the first passivation layer 23 and the second metal layer 222, and the orthographic projection of the transparent electrode layer 25 on the substrate 21 covers the orthographic projection of the third bonding terminal 34 on the substrate 21.

Wherein, the material of the transparent electrode layer 25 may be an electrically conductive and oxidation resistant material such as indium tin oxide, which is not limited in the present embodiment. By disposing the transparent electrode layer 25 on the third bonding terminal 34, oxidation of the third bonding terminal 34 may be prevented.

In another optional embodiment, referring to FIG. 7, the second metal layer 222 may include a copper layer and a copper-nickel-alloy layer disposed on the one side of the copper layer that is away from the substrate 21. By providing the copper-nickel-alloy layer on the surface of the copper layer, oxidation of the third bonding terminal 34 of the peripheral area BB may be prevented.

The orthographic projection of the copper-nickel-alloy layer on the substrate 21 may cover the orthographic projection of the copper layer on the substrate 21.

In the present embodiment, because copper-nickel alloy has high strength, corrosion resistance and hardness, by covering the entire surface of the copper layer with the copper-nickel-alloy layer, oxidation of the copper layer may be prevented, to prevent oxidation of the bonding terminals. That is, it is not necessary to dispose the transparent electrode layer on the surface of the third bonding terminal 34, and therefore a masking process may be omitted, which may simplify the process steps, increase the yield, and reduce the cost.

In the present embodiment, a molybdenum layer or molybdenum-niobium-alloy layer may be disposed between the fourth passivation layer 225 and the second metal layer 222 in the insulating layer, which may increase the fastness of the joining between the second metal layer 222 and the fourth passivation layer 225 in the insulating layer.

The thickness of the molybdenum-niobium-alloy layer may, for example, be 300 angstroms, the thickness of the copper layer may, for example, be 6000 angstroms, and the thickness of the copper-nickel-alloy layer may, for example, be 500 angstroms.

Figure 8:
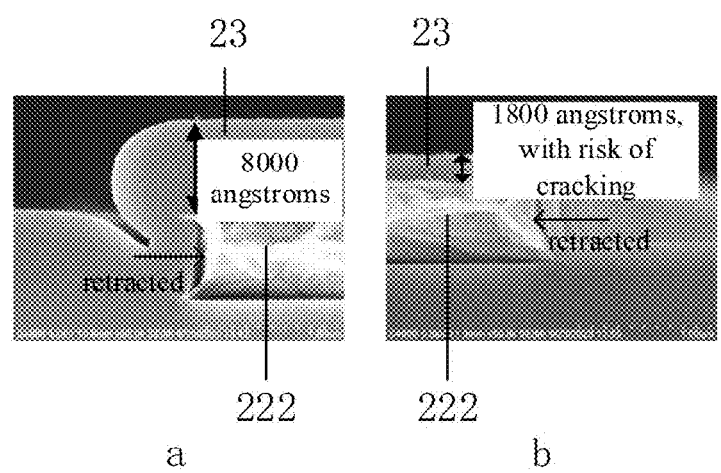
FIG. 8 shows scanning-electron-microscope photographs of the first passivation layers of different thicknesses in the second displaying base plate according to an embodiment of the present disclosure.

The inventor analyses and finds out by using scanning electron microscope that, in the present embodiment, due to the speed of the etching of the copper layer in the second metal layer 222 is high, the etched copper layer is retracted as compared with the copper-nickel-alloy layer, as shown in FIG. 8, which results in a risk of cracking in the process of the manufacture of the first passivation layer 23. Especially, when the thickness of the first passivation layer 23 is low, the risk of cracking is increased, as shown by the b in FIG. 8.

In order to reduce the risk of cracking of the first passivation layer 23, the thickness of the first passivation layer 23 may be greater than or equal to 8000 angstroms, as shown by the a in FIG. 8.

Referring to FIGS. 2 and 7, a first planarization layer 26 may be disposed on the one side of the light shielding layer 24 that is away from the substrate 21, the orthographic projection of the first planarization layer 26 on the substrate 21 and the orthographic projections of the bonding terminals on the substrate 21 do not overlap, and the orthographic projection of the first passivation layer 23 on the substrate 21 and the orthographic projections of the bonding terminals on the substrate 21 do not overlap.

The material of the first planarization layer 26 may, for example, be an organic material such as a polyacrylic-acid-type resin, which is not limited in the present embodiment.

In order to prevent oxidation of the bonding terminals in their storage before the bonding process, in the manufacturing process of the displaying base plate, the position of the first passivation layer 23 corresponding to the bonding terminals may not be firstly etched.

Instead, before the bonding process, by using the first planarization layer 26 that is patterned as the mask, the first passivation layer 23 is etched, wherein the orthographic projection of the first passivation layer 23 on the substrate 21 and the orthographic projections of the bonding terminals on the substrate 21 do not overlap, and subsequently the bonding process is performed.

In order to further reduce the coupling capacitance formed between the light shielding layer 24 and the second metal layer 222, referring to FIG. 10, a second planarization layer 101 may be disposed between the light shielding layer 24 and the first passivation layer 23, the orthographic projection of the second planarization layer 101 on the substrate 21 and the orthographic projections of the bonding terminals on the substrate 21 do not overlap, and the orthographic projection of the first passivation layer 23 on the substrate 21 and the orthographic projections of the bonding terminals on the substrate 21 do not overlap.

The material of the second planarization layer 101 may, for example, be an organic material such as a poly acrylic-acid-type resin, which is not limited in the present embodiment.

By disposing the second planarization layer 101 between the light shielding layer 24 and the first passivation layer 23, the distance between the light shielding layer 24 and the second metal layer 222 is increased, which may reduce the negative affection caused by the coupling capacitance between the light shielding layer 24 and the second metal layer 222.

In order to prevent oxidation of the bonding terminals in their storage before the bonding process, in the manufacturing process of the displaying base plate, the position of the first passivation layer 23 corresponding to the bonding terminals may not be firstly etched.

Instead, before the bonding process, by using the second planarization layer 101 as the mask, the first passivation layer 23 is etched, wherein the orthographic projection of the first passivation layer 23 on the substrate 21 and the orthographic projection of the bonding terminals on the substrate 21 do not overlap, and subsequently the bonding process is performed.

Figure 11:
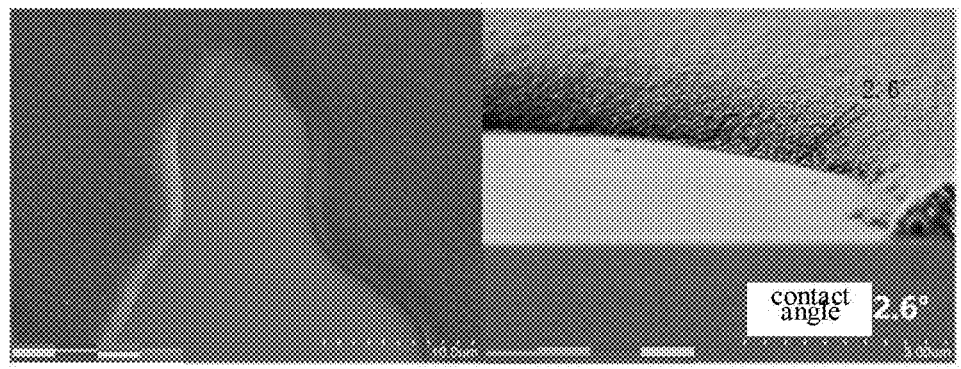
FIG. 11 shows a picture of no residue of the light shielding layer according to an embodiment of the present disclosure.
Figure 12:
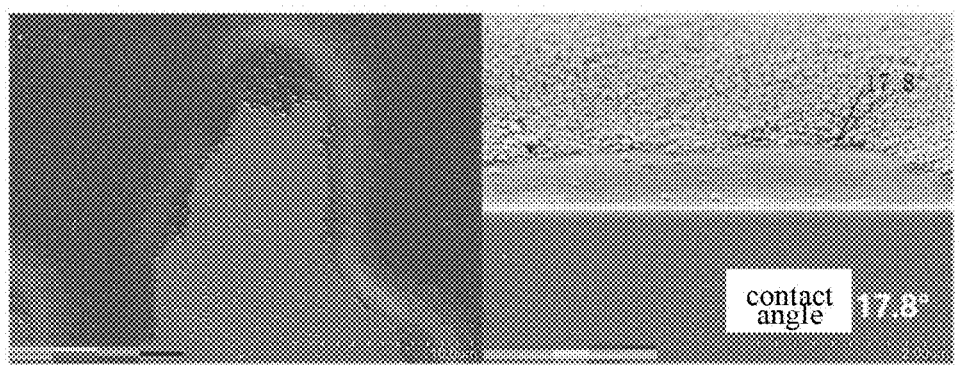
FIG. 12 shows a picture of residue of the light shielding layer according to an embodiment of the present disclosure.

The inventor finds out that the material of the light shielding layer 24 has a smaller contact angle at a hydrophilic surface (—OH interface), which may form a better pattern, as shown in FIG. 11. A residue is easy to appear when a contact angle on a substrate of a poor hydrophilicity is large, and the residue is a particle visible in a scanning electron microscope, as shown in FIG. 12, wherein the residue is irrelevant to the processes of exposure and development.

The interface of the second planarization layer 101 is a polyacrylic-acid-type resin, which is a hydrophobic material, and a residue is easy to appear on the surface of the material of the light shielding layer 24. The residue of the light shielding layer 24 may have consequences in two aspects, wherein the first is that the residue in the transparent area seriously affects the transmittance of the transparent area, and the second is that the residue in the bonding area may result in poor bonding.

In order to prevent residue of the light shielding layer 24, referring to FIG. 10, a second passivation layer 102 may be disposed between the light shielding layer 24 and the second planarization layer 101, and the orthographic projection of the second passivation layer 102 on the substrate 21 and the orthographic projections of the bonding terminals on the substrate 21 do not overlap.

The material of the second passivation layer 102 may include inorganic materials such as silicon oxide and silicon nitride, which is not limited in the present embodiment.

By disposing the second passivation layer 102 between the light shielding layer 24 and the second planarization layer 101, residue of the light shielding layer 24 on the second planarization layer 101 may be prevented.

In the displaying base plate shown in FIGS. 2 and 7, due to the distance between the light shielding layer 24 and the second metal layer 222 is small, in order to prevent forming a coupling capacitance between the light shielding layer 24 and the second metal layer 222, the material of the light shielding layer 24 may be an organic black material.

The columns b and c in FIG. 9 are the parameters of two organic black materials. Due to the dielectric constants of the organic black materials are relatively low, which are 3.7 and 3.5, by manufacturing the light shielding layer 24 in FIGS. 2 and 7 by using the organic black materials, the coupling capacitance formed between the light shielding layer 24 and the second metal layer 222 may be reduced, to prevent the light shielding layer 24 from affecting the load of the second metal layer 222. In practical applications, the resolving power (~5 μm) of the organic black material of the column c in the exposing process is better than the resolving power (>9 μm) of the material of the column b, the organic black material of the column c may be selected to manufacture the light shielding layer 24, which may increase the controlling precision of the exposing process.

In the displaying base plate shown in FIG. 10, the material of the light shielding layer 24 may be a carbon-black material.

The column a in FIG. 9 is the parameters of a carbon-black material. The dielectric constant (15) of the carbon-black material is greater than the dielectric constants (3.7 and 3.5) of the organic black materials. However, because in FIG. 10 the second planarization layer 101 is disposed between the light shielding layer 24 and the second metal layer 222, which increases the distance between the light shielding layer 24 and the second metal layer 222, the carbon-black materials of higher dielectric constants may be selected as the material of the light shielding layer 24, which also may prevent the affection by the coupling capacitance between the light shielding layer 24 and the second metal layer 222, to prevent the light shielding layer 24 from affecting the load of the second metal layer 222.

It should be noted that the light shielding layer 24 in FIG. 10 may also select the organic black materials, which may further reduce the coupling capacitance. However, due to the resolving power (~0 μm) of the carbon-black material of the column a in the exposing process is better than the resolving powers of the organic black materials, the carbon-black material of the column a is selected to fabricate the light shielding layer 24, which may increase the controlling precision of the exposing process.

In a particular application, the thickness of the light shielding layer 24 may be determined according to the value of the optical density of the particular material and the design value of the transmittance of the light shielding layer 24, which is not limited in the present embodiment.

The thickness of the light shielding layer 24 may be described below by taking the case as an example in which the transmittance of the light shielding layer 24 is less than or equal to 1%.

The value of the optical density (OD) of the material of the column a in FIG. 9 is 4.0/μm, and in order that the transmittance of the light shielding layer 24 of the material of the column a is less than or equal to 1%, the thickness of the light shielding layer 24 may be greater than or equal to 0.5 μm.

The value of the optical density (OD) of the material of the column b in FIG. 9 is 2.0/μm, and in order that the transmittance of the light shielding layer 24 of the material of the column b is less than or equal to 1%, the thickness of the light shielding layer 24 may be greater than or equal to 1.0 μm.

The value of the optical density (OD) of the material of the column c in FIG. 9 is 2.6/μm, and in order that the transmittance of the light shielding layer 24 of the material of the column c is less than or equal to 1%, the thickness of the light shielding layer 24 may be greater than or equal to 0.77 μm.

In an optional embodiment, referring to FIGS. 2, 7 and 10, an electroplating functional layer 27 may be disposed between the substrate 21 and the first metal layer 221, and the orthographic projection of the electroplating functional layer 27 on the substrate 21 and the orthographic projection of the first metal layer 221 on the substrate 21 completely coincide. The electroplating functional layer 27 is used to increase the fastness of the joining between the first metal layer 221 and the substrate 21.

The material of the electroplating functional layer 27 may, for example, be molybdenum or a molybdenum-niobium-alloy, which is not limited in the present embodiment.

Another embodiment of the present disclosure further provides a displaying apparatus, wherein the displaying apparatus may include the displaying base plate according to any one of the above embodiments.

It should be noted that the displaying apparatus according to the present embodiment may be any products or components that have the function of 2D or 3D displaying, such as a display panel, an electronic paper, a mobile phone, a tablet personal computer, a TV set, a notebook computer, a digital photo frame and a navigator.

Figure 13:
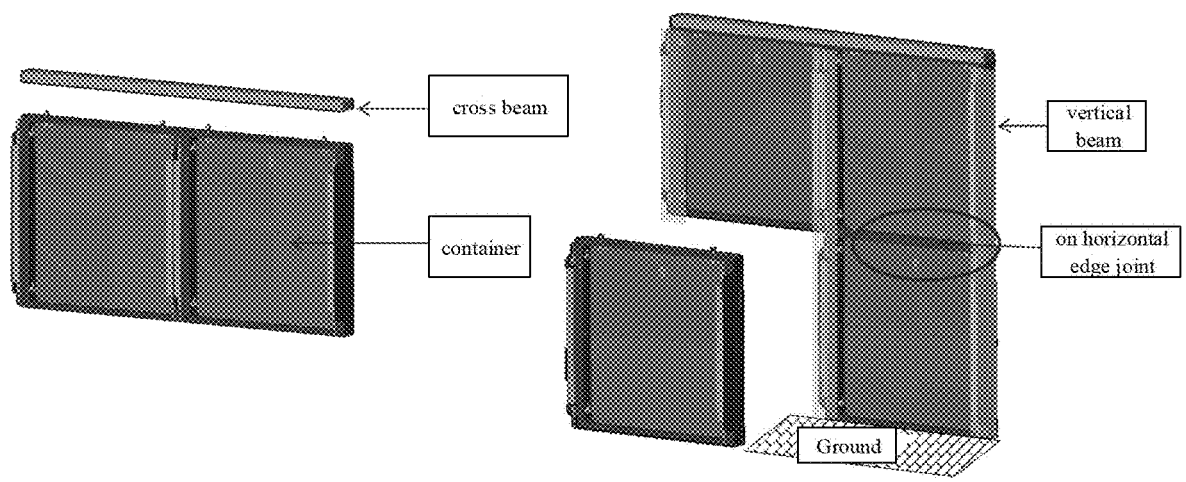
FIG. 13 shows a schematic structural diagram of the displaying apparatus according to an embodiment of the present disclosure.

In a particular embodiment, the displaying apparatus may include a plurality of displaying base plates according to any one of the above embodiments. As shown in FIG. 13, the plurality of displaying base plates may be fixed to a vertical beam by using container locks. The plurality of displaying base plates may realize vertical seamless splicing therebetween, or, in other words, there is on horizontal edge joint, to result in a wider and opened visual effect.

In the present embodiment, the displaying apparatus may be applied for outdoor transparent displaying. Due to the LED chip uses an inorganic material, it has a good reliability in outdoor or half-outdoor scenes.

The pixels in the displaying base plate may be in a rectangular array, whereby the light transmitting areas are even, thereby improving the visual effect.

The displaying apparatus according to the present embodiment may use 100-micrometer-graded LED chips/wirings, to realize a transmittance >70% and a wide viewing angle >160°. By using active driving, which may result in accurate light controlling, a good low-grayscale performance and a low power consumption, a high pixel density and a low visual range, whereby the frame exhibition is more subtle, a low weight to facilitate disassembling and assembling, whereby the splicing is infinite. The wireless signal transmission has a good extensibility and facilitates maintenance. The spacing between the pixel units may be 3 mm, the watching distance is >8 meters, the transmittance reaches 85%, and the brightness reaches 2000 nit (before calibration).

Figure 14:
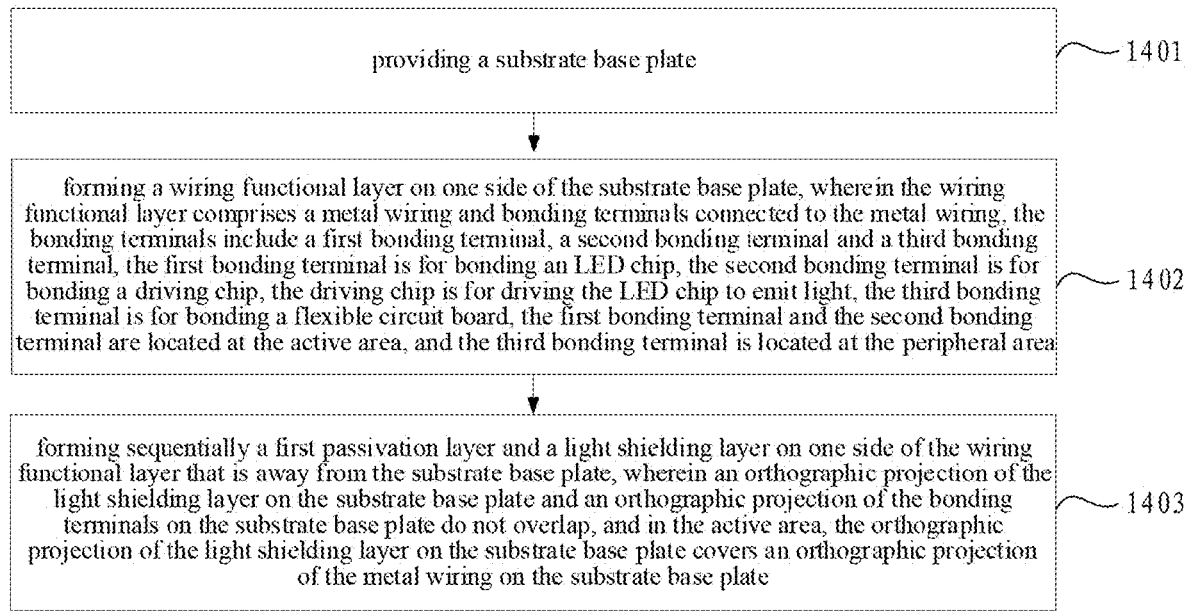
FIG. 14 shows a flow chart of the steps of the manufacturing method of a displaying base plate according to an embodiment of the present disclosure.

Another embodiment of the present disclosure further provides a manufacturing method of a displaying base plate, wherein the displaying base plate includes an active area and a peripheral area located at a periphery of the active area. Referring to FIG. 14, the manufacturing method includes:

Step 1401: providing a substrate.

Step 1402: forming a wiring functional layer on one side of the substrate, wherein the wiring functional layer includes a metal wiring and bonding terminals connected to the metal wiring, the bonding terminals include a first bonding terminal, a second bonding terminal and a third bonding terminal, the first bonding terminal is for bonding an LED chip, the second bonding terminal is for bonding a driving chip, the driving chip is for driving the LED chip to emit light, the third bonding terminal is for bonding a flexible circuit board, the first bonding terminal and the second bonding terminal are located at the active area, and the third bonding terminal is located at the peripheral area.

Step 1403: forming sequentially a first passivation layer and a light shielding layer on one side of the wiring functional layer that is away from the substrate, wherein an orthographic projection of the light shielding layer on the substrate and an orthographic projection of the bonding terminals on the substrate do not overlap, and in the active area, the orthographic projection of the light shielding layer on the substrate covers an orthographic projection of the metal wiring on the substrate.

By using the manufacturing method according to the present embodiment, the displaying base plate according to any one of the above embodiments may be obtained.

In an optional embodiment, the step 1403 may particularly include:

forming a passivating-material thin film on one side of the wiring functional layer that is away from the substrate;

by using a first patterning process, forming the light shielding layer on one side of the passivating-material thin film that is away from the substrate;

by using a second patterning process, forming a first planarization layer on one side of the light shielding layer that is away from the substrate, wherein an orthographic projection of the first planarization layer on the substrate and the orthographic projection of the bonding terminals on the substrate do not overlap; and by using the first planarization layer as a mask, etching the passivating-material thin film, to form the first passivation layer, wherein an orthographic projection of the first passivation layer on the substrate and the orthographic projection of the bonding terminals on the substrate do not overlap.

Figure 15:
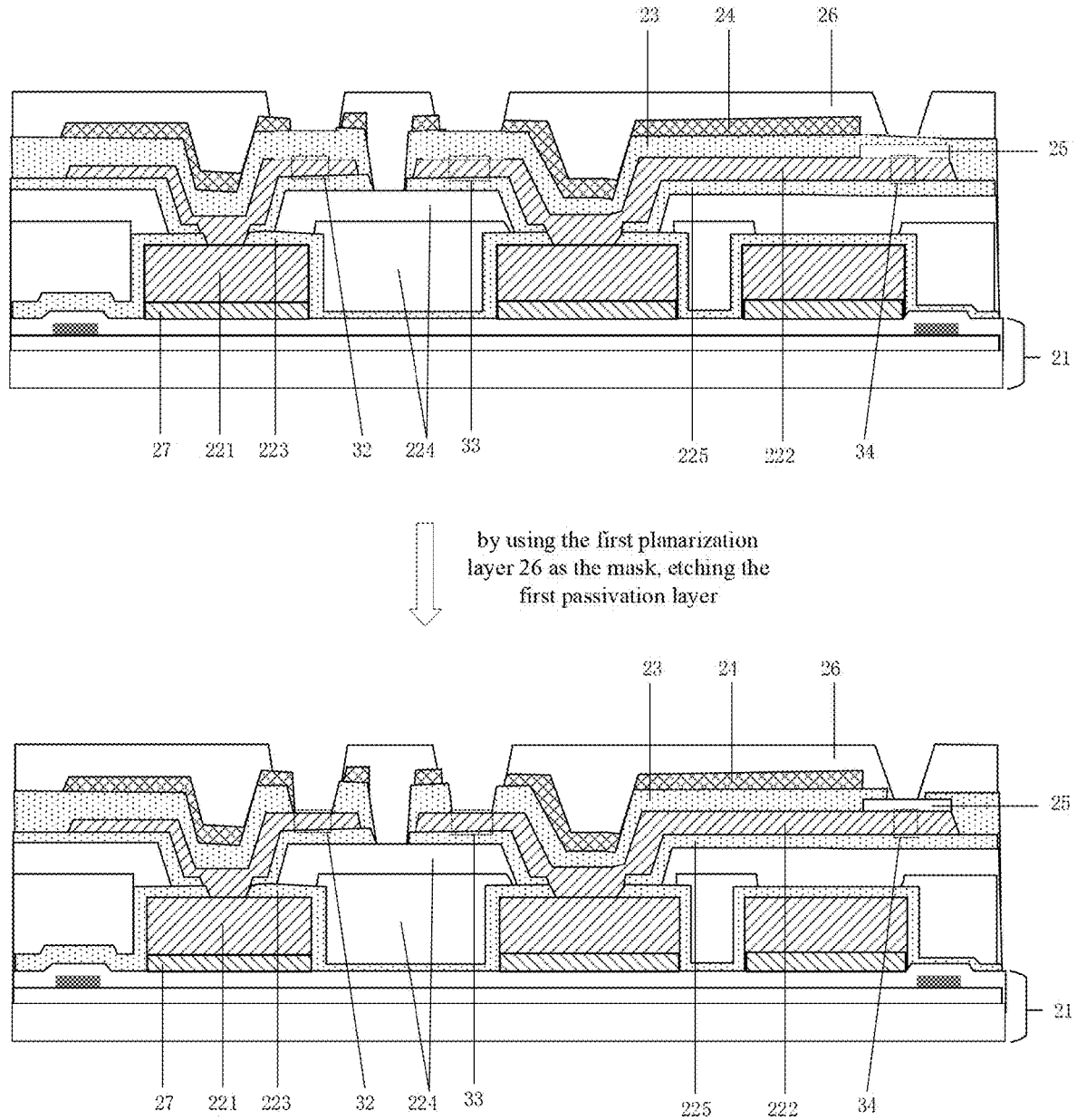
FIG. 15 shows a flow chart of the process for manufacturing the first passivation layer in the displaying base plate according to an embodiment of the present disclosure.

In the present embodiment, in order to prevent the problem of oxidation of the bonding terminals in their storage before the bonding process, referring to FIG. 15, in the process of manufacturing the displaying base plate, the first passivation layer 23 may not be etched firstly.

When the bonding process is required to be performed, by using the first planarization layer 26 that is patterned as the mask, the first passivation layer 23 is etched, and subsequently the bonding process is performed.

In another optional embodiment, the step 1403 may particularly include:

forming a passivating-material thin film on one side of the wiring functional layer that is away from the substrate;

by using a third patterning process, forming a second planarization layer on one side of the passivating-material thin film that is away from the substrate, wherein an orthographic projection of the second planarization layer on the substrate and the orthographic projection of the bonding terminals on the substrate do not overlap;

by using a fourth patterning process, forming the light shielding layer on one side of the second planarization layer that is away from the substrate; and by using the second planarization layer as a mask, etching the passivating-material thin film, to form the first passivation layer, wherein an orthographic projection of the first passivation layer on the substrate and the orthographic projection of the bonding terminals on the substrate do not overlap.

In the present embodiment, in order to prevent the problem of oxidation of the bonding terminals in their storage before the bonding process, in the process of manufacturing the displaying base plate, the first passivation layer may not be etched firstly. When the bonding process is required to be performed, by using the second planarization layer that is patterned as the mask, the first passivation layer is etched, and subsequently the bonding process is performed.

In the present embodiment, before the step of forming the light shielding layer on the one side of the second planarization layer that is away from the substrate, the method may further include the following steps: by using a fifth patterning process, forming a second passivation layer on one side of the second planarization layer that is away from the substrate, wherein an orthographic projection of the second passivation layer on the substrate and the orthographic projection of the bonding terminals on the substrate do not overlap.

Correspondingly, the step of forming the light shielding layer on the one side of the second planarization layer that is away from the substrate may include: forming the light shielding layer on one side of the second passivation layer that is away from the substrate.

In an optional embodiment, the step 1402 may particularly include:

forming sequentially a first metal layer, a third passivation layer, a third planarization layer, a fourth passivation layer and a second metal layer on one side of the substrate, wherein the metal wiring includes a first metal wiring located at the first metal layer and a second metal wiring located at the second metal layer, the bonding terminals are located at the second metal layer and are interconnected with the second metal wiring, and the second metal wiring and the first metal wiring are connected by a via hole disposed in the insulating layer.

The third planarization layer may be formed by:

by using a sixth patterning process, forming a fourth planarization layer on one side of the third passivation layer that is away from the substrate; and by using a seventh patterning process, forming a fifth planarization layer on one side of the fourth planarization layer that is away from the substrate, wherein the fourth planarization layer and the fifth planarization layer form the third planarization layer.

Figure 16:
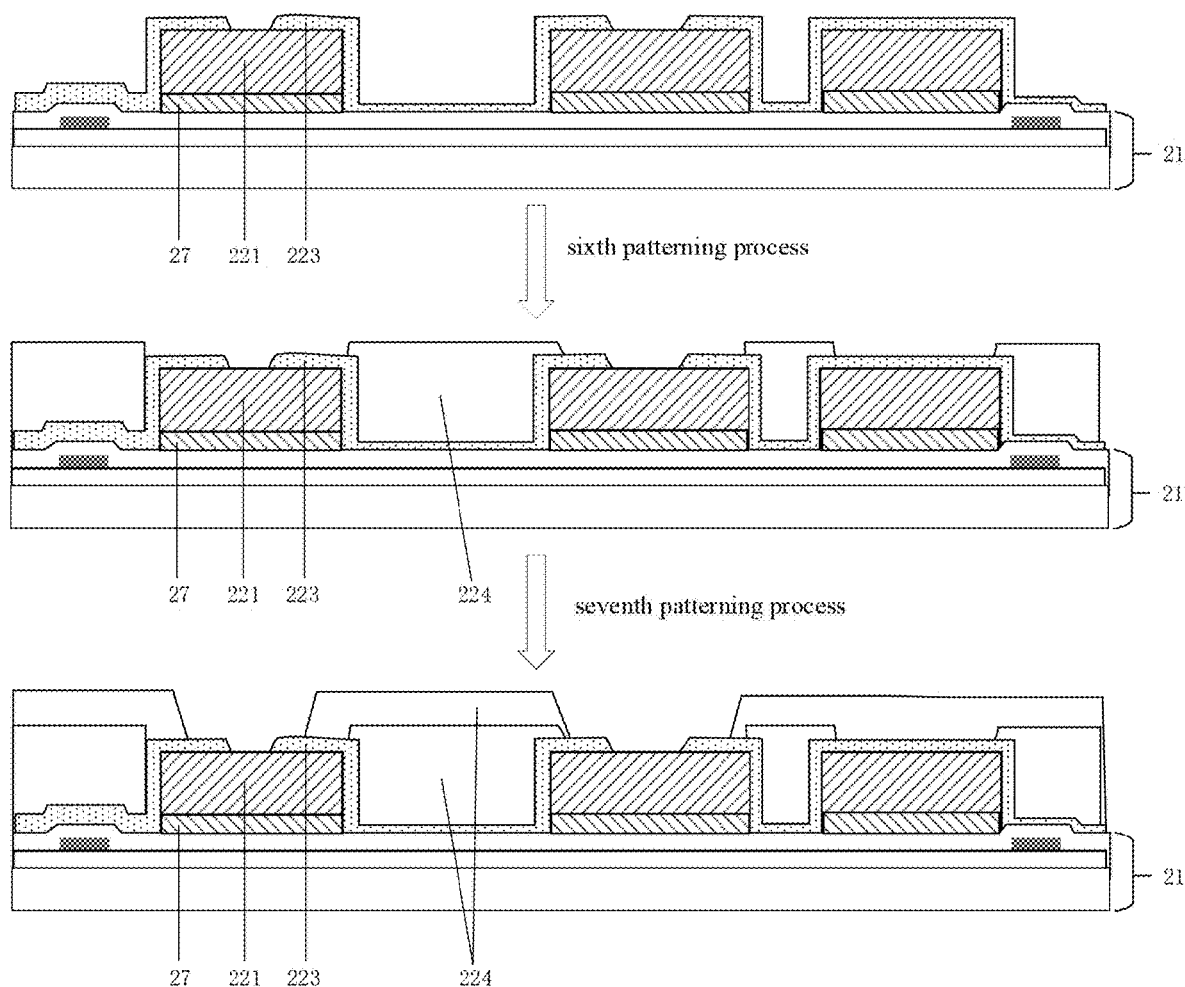
FIG. 16 shows a flow chart of the process for manufacturing the third planarization layer in the displaying base plate according to an embodiment of the present disclosure.

Referring to FIG. 16, the third planarization layer 224 is formed by using two times of patterning processes, which may reduce the process difficulty, and increase the controlling precision of the process.

The patterning process according to the present embodiment may include at least one of the following process steps: a film-formation process, an exposing and developing process, an etching process and a photoresist removing process. The film-formation process may be one of a magnetron-sputtering process, a thermal-vapor-deposition process, an electron-beam-vapor-deposition process and an electroplating process. The etching process may be a dry-etching process or a wet-etching process. The particular steps of the patterning process may be designed according to the materials and the structure of the film layers, which is not limited in the present embodiment.

Figure 17A:
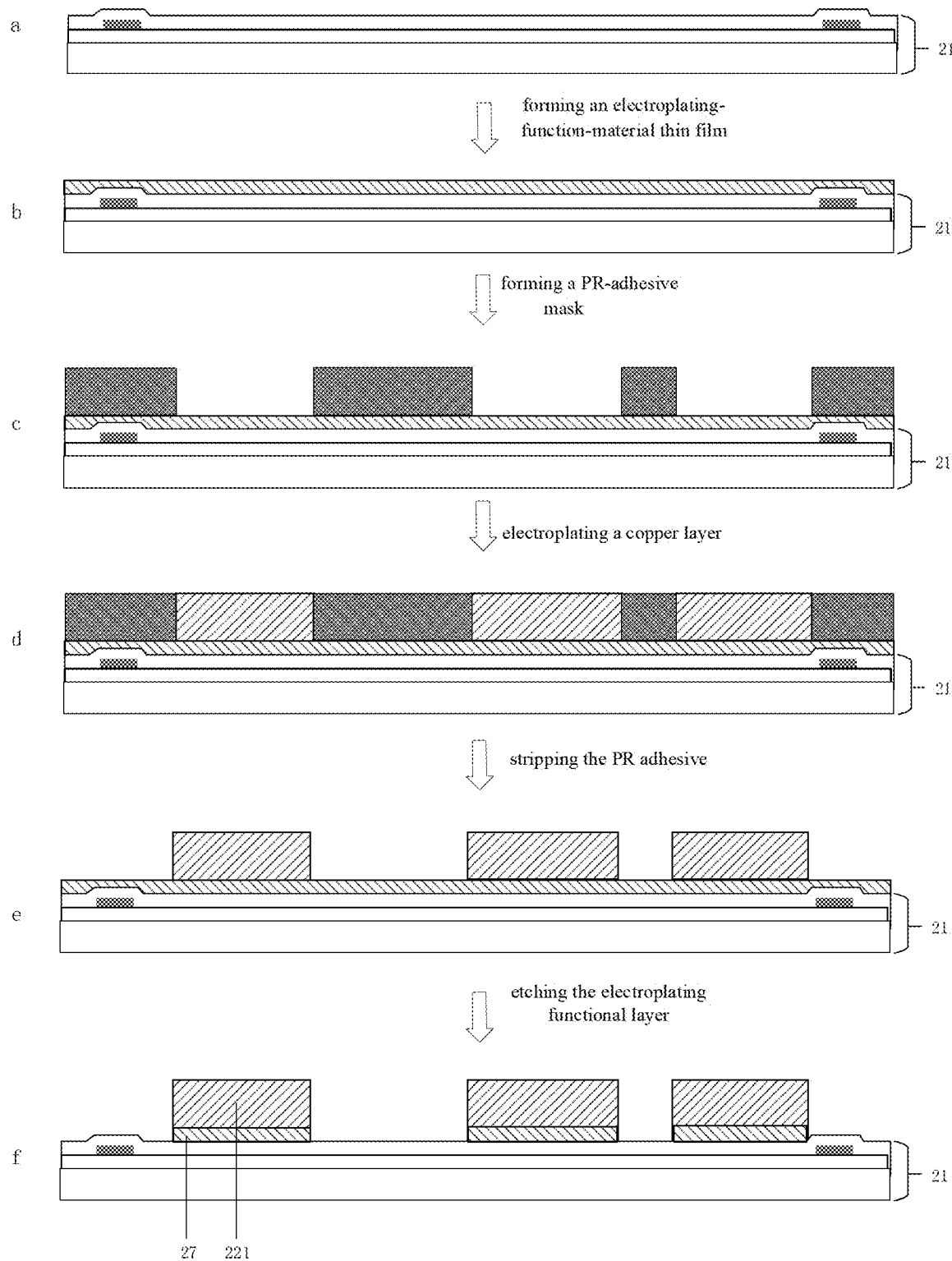
FIG. 17*a* shows a flow chart of the process for manufacturing the displaying base plate according to an embodiment of the present disclosure.
Figure 17B:
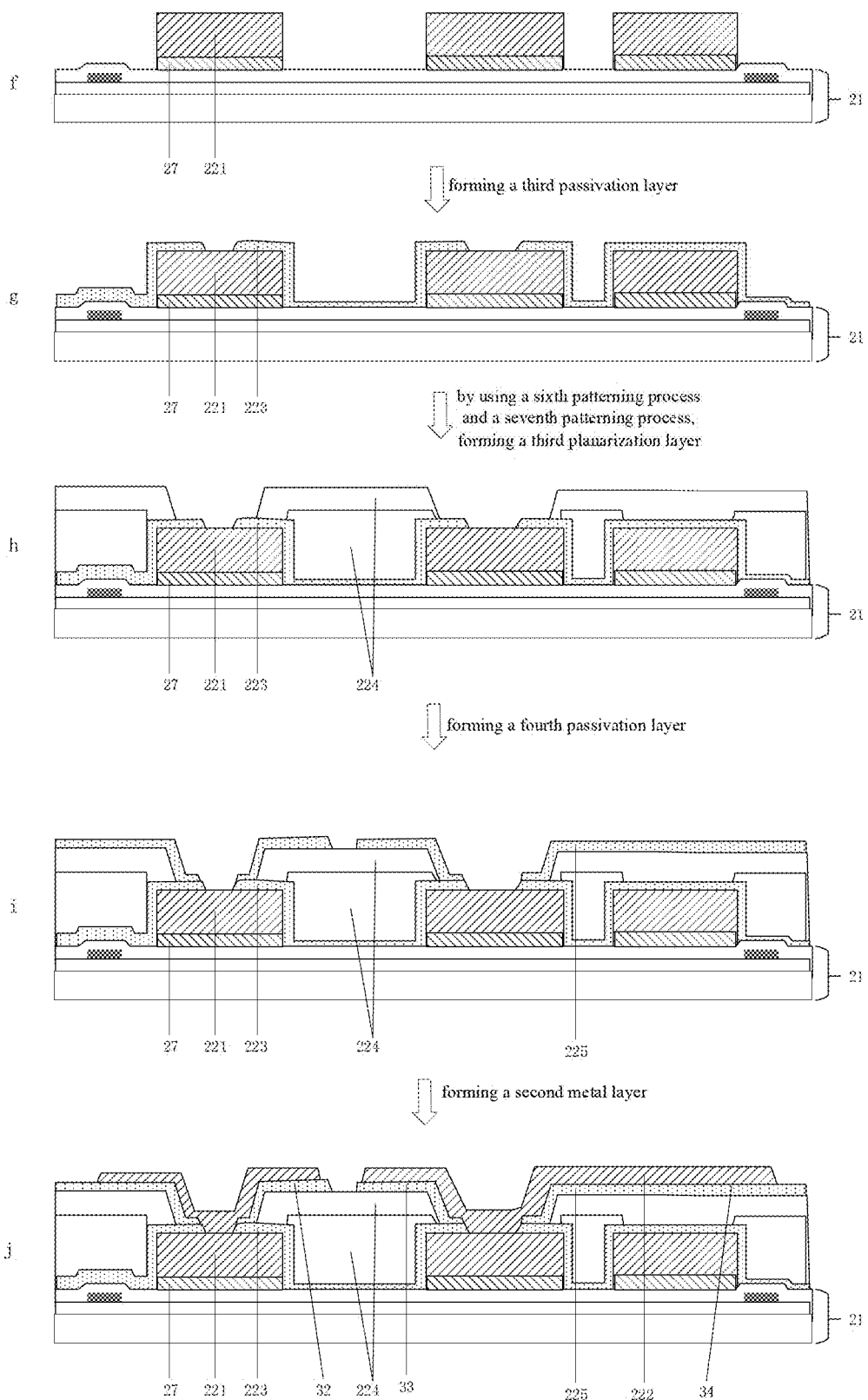
FIG. 17*b* shows a flow chart of the process for manufacturing the displaying base plate according to an embodiment of the present disclosure.
Figure 17C:
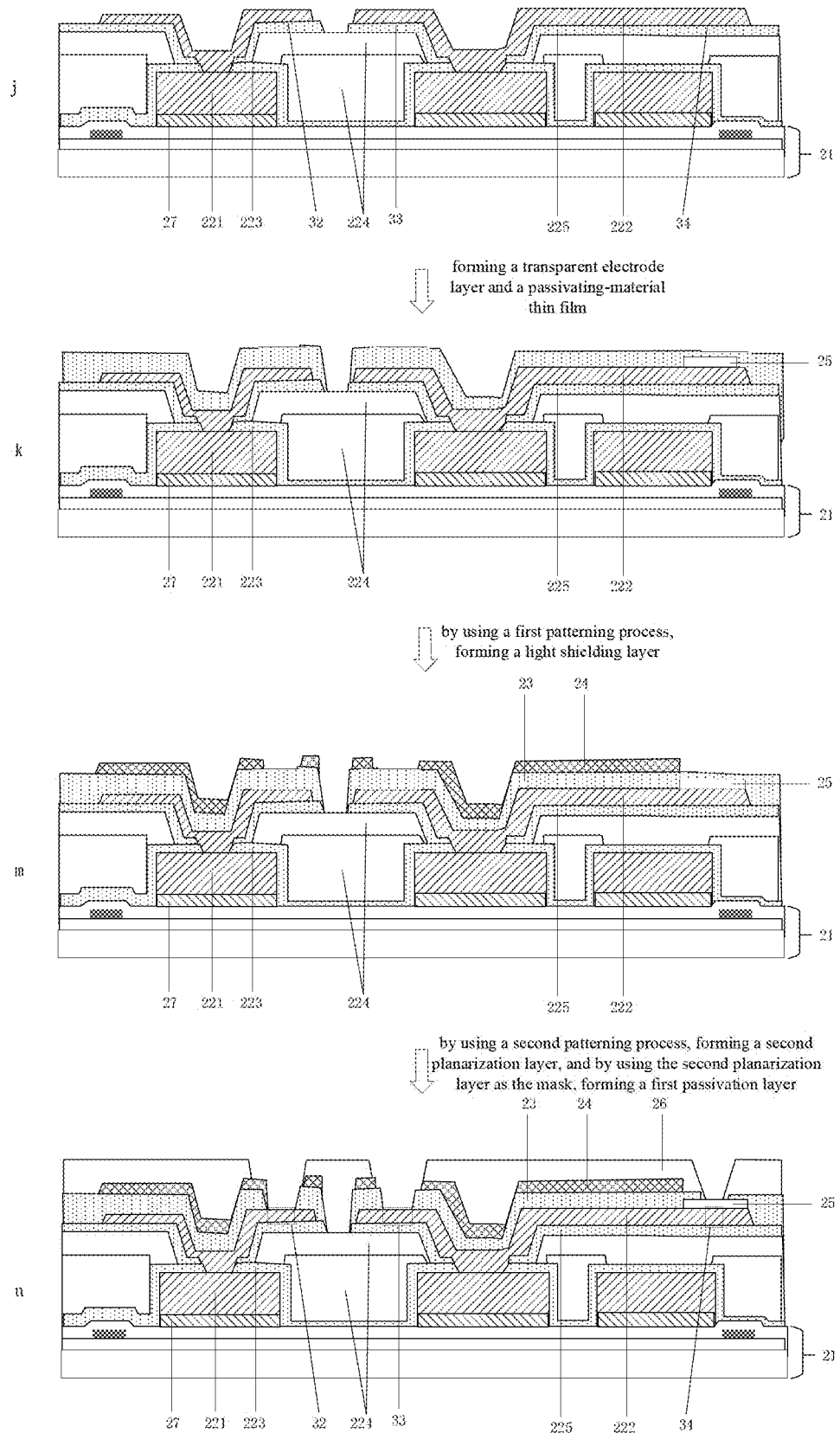
FIG. 17*c* shows a flow chart of the process for manufacturing the displaying base plate according to an embodiment of the present disclosure.

Referring to FIGS. 17a to 17c, FIGS. 17a to 17c show a flow chart of the manufacturing process of a first displaying base plate, which may particularly include the following steps:

providing a substrate 21, as shown by the a in FIG. 17a;

forming an electroplating-function-material thin film on the substrate 21, as shown by the b in FIG. 17a;

forming a PR-adhesive mask, as shown by the c in FIG. 17a;

electroplating a copper layer, as shown by the d in FIG. 17a;

stripping the PR adhesive, to form a first metal layer 221, as shown by the e in FIG. 17a;

by using the first metal layer 221 as the mask, etching to obtain an electroplating functional layer 27, as shown by the f in FIG. 17a or 17b;

forming a third passivation layer 223, as shown by the g in FIG. 17b;

by using a sixth patterning process and a seventh patterning process, forming a third planarization layer 224, as shown by the h in FIG. 17b;

forming a fourth passivation layer 225, as shown by the i in FIG. 17b;

forming a second metal layer 222, as shown by the j in FIG. 17b or 17c;

forming a transparent electrode layer 25 and a passivating-material thin film, as shown by the k in FIG. 17c;

by using a first patterning process, forming a light shielding layer 24, as shown by the m in FIG. 17c; and by using a second patterning process, forming a second planarization layer 26, and by using the second planarization layer 26 as the mask, etching the passivating-material thin film, to form the first passivation layer 23, as shown by the n in FIG. 17c, to obtain the displaying base plate shown in FIG. 2.

The present embodiment provides a manufacturing method of a displaying base plate, a displaying base plate and a displaying apparatus, wherein the displaying base plate includes an active area and a peripheral area located at a periphery of the active area, and the displaying base plate includes: a substrate; a wiring functional layer disposed on one side of the substrate, wherein the wiring functional layer includes a metal wiring and bonding terminals connected to the metal wiring, the bonding terminals include a first bonding terminal, a second bonding terminal and a third bonding terminal, the first bonding terminal is for bonding an LED chip, the second bonding terminal is for bonding a driving chip, the driving chip is for driving the LED chip to emit light, the third bonding terminal is for bonding a flexible circuit board, the first bonding terminal and the second bonding terminal are located at the active area, and the third bonding terminal is located at the peripheral area; a first passivation layer disposed on one side of the wiring functional layer that is away from the substrate; and a light shielding layer disposed on one side of the first passivation layer that is away from the substrate, wherein an orthographic projection of the light shielding layer on the substrate and an orthographic projection of the bonding terminals on the substrate do not overlap, and in the active area, the orthographic projection of the light shielding layer on the substrate covers an orthographic projection of the metal wiring on the substrate. In the technical solutions of the present disclosure, by providing the light shielding layer on the one side of the wiring functional layer that is away from the substrate, wherein the orthographic projection of the light shielding layer on the substrate covers the orthographic projection of the metal wiring on the substrate, the reflection of the light ray by the metal wiring is prevented, which increases the contrast of the displaying apparatus.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The manufacturing method of the displaying base plate, the displaying base plate and the displaying apparatus according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure. The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A displaying base plate, including an active area and a peripheral area located at a periphery of the active area, wherein the displaying base plate comprises:
   a substrate;
   a wiring functional layer disposed on one side of the substrate, wherein the wiring functional layer comprises metal wirings and bonding terminals connected to the metal wirings, the bonding terminals comprise a first bonding terminal, the first bonding terminal is configured for bonding an LED chip, and the first bonding terminal is located at the active area;
   a first passivation layer disposed on one side of the wiring functional layer that is away from the substrate; and
   a light shielding layer disposed on one side of the first passivation layer that is away from the substrate, wherein an orthographic projection of the light shielding layer on the substrate and orthographic projections of the bonding terminals on the substrate do not overlap, and in the active area, the orthographic projection of the light shielding layer on the substrate at least partially covers orthographic projections of the metal wirings on the substrate, and an orthographic projection of the first passivation layer on the substrate and the orthographic projections of the bonding terminals on the substrate do not overlap.

2. The displaying base plate according to claim 1, wherein in the active area, the orthographic projection of the light shielding layer on the substrate and the orthographic projections of the metal wirings on the substrate completely coincide.

3. The displaying base plate according to claim 1, wherein the wiring functional layer comprises: a first metal layer, an insulating layer and a second metal layer that are disposed in stack, and the first metal layer is disposed closer to the substrate;
   the bonding terminals further comprise a second bonding terminal and a third bonding terminal, the second bonding terminal is configured for bonding a driving chip, the driving chip is configured for driving the LED chip to emit light, the third bonding terminal is configured for bonding a flexible circuit board, the second bonding terminal is located at the active area, and the third bonding terminal is located at the peripheral area; and
   the metal wiring comprises a first metal wiring located at the first metal layer and a second metal wiring located at the second metal layer, the bonding terminals are located at the second metal layer and are interconnected with the second metal wiring, and the second metal wiring and the first metal wiring are connected by a via hole disposed in the insulating layer.

4. The displaying base plate according to claim 3, wherein the second metal layer is a copper layer, a transparent electrode layer is disposed between the first passivation layer and the second metal layer, and an orthographic projection of the transparent electrode layer on the substrate covers an orthographic projection of the third bonding terminal on the substrate.

5. The displaying base plate according to claim 3, wherein the second metal layer comprises a copper layer and a copper-nickel-alloy layer disposed on one side of the copper layer that is away from the substrate, and a thickness of the first passivation layer is greater than or equal to 8000 angstroms.

6. The displaying base plate according to claim 5, wherein an orthographic projection of the copper-nickel-alloy layer on the substrate covers an orthographic projection of the copper layer on the substrate.

7. The displaying base plate according to claim 4, wherein a first planarization layer is disposed on one side of the light shielding layer that is away from the substrate, and an orthographic projection of the first planarization layer on the substrate and the orthographic projections of the bonding terminals on the substrate do not overlap.

8. The displaying base plate according to claim 4, wherein a second planarization layer is disposed between the light shielding layer and the first passivation layer, and an orthographic projection of the second planarization layer on the substrate and the orthographic projections of the bonding terminals on the substrate do not overlap.

9. The displaying base plate according to claim 8, wherein a second passivation layer is disposed between the light shielding layer and the second planarization layer, and an orthographic projection of the second passivation layer on the substrate and the orthographic projections of the bonding terminals on the substrate do not overlap.

10. The displaying base plate according to claim 3, wherein the insulating layer comprises a third passivation layer, a third planarization layer and a fourth passivation layer that are disposed in stack on one side of the first metal layer that is away from the substrate, and the third passivation layer is disposed closer to the first metal layer.

11. The displaying base plate according to claim 3, wherein an electroplating functional layer is disposed between the substrate and the first metal layer, and an orthographic projection of the electroplating functional layer on the substrate and an orthographic projection of the first metal layer on the substrate completely coincide.

12. The displaying base plate according to claim 3, wherein the active area comprises a plurality of pixel units that are arranged in an array, and the first metal wiring comprises:
    at least one first sub-wiring extending in a pixel column direction in the active area, wherein the first sub-wiring has a first line width in a pixel row direction; and
    at least one second sub-wiring extending in the pixel column direction in the active area, wherein the second sub-wiring has a second line width in the pixel row direction, and the second line width is less than the first line width.

13. The displaying base plate according to claim 12, wherein a second sub-wiring adjacent to a first sub-wiring in the pixel row direction and the first sub-wiring have a first spacing therebetween, wherein the first spacing is greater than three times the first line width.

14. The displaying base plate according to claim 12, wherein an orthographic projection of the first bonding terminal on the substrate is located in an area of an orthographic projection of the first sub-wiring on the substrate.

15. A displaying apparatus, wherein the displaying apparatus comprises the displaying base plate according to claim 1.

16. A manufacturing method of a displaying base plate, wherein the displaying base plate comprises an active area and a peripheral area located at a periphery of the active area, and the manufacturing method comprises:
    providing a substrate;
    forming a wiring functional layer on one side of the substrate, wherein the wiring functional layer comprises a metal wiring and bonding terminals connected to the metal wiring, the bonding terminals comprise a first bonding terminal, the first bonding terminal is configured for bonding an LED chip, and the first bonding terminal is located at the active area; and
    forming sequentially a first passivation layer and a light shielding layer on one side of the wiring functional layer that is away from the substrate, wherein an orthographic projection of the light shielding layer on the substrate and orthographic projections of the bonding terminals on the substrate do not overlap, and in the active area, the orthographic projection of the light shielding layer on the substrate at least partially covers orthographic projections of the metal wirings on the substrate, and an orthographic projection of the first passivation layer on the substrate and the orthographic projections of the bonding terminals on the substrate do not overlap.

17. The manufacturing method according to claim 16, wherein the step of forming sequentially the first passivation layer and the light shielding layer on the one side of the wiring functional layer that is away from the substrate comprises:
    forming a passivating-material thin film on one side of the wiring functional layer that is away from the substrate;
    by using a first patterning process, forming the light shielding layer on one side of the passivating-material thin film that is away from the substrate;
    by using a second patterning process, forming a first planarization layer on one side of the light shielding layer that is away from the substrate, wherein an orthographic projection of the first planarization layer on the substrate and the orthographic projection of the bonding terminals on the substrate do not overlap; and
    by using the first planarization layer as a mask, etching the passivating-material thin film, to form the first passivation layer.

18. The manufacturing method according to claim 16, wherein the step of forming sequentially the first passivation layer and the light shielding layer on the one side of the wiring functional layer that is away from the substrate comprises:
    forming a passivating-material thin film on one side of the wiring functional layer that is away from the substrate;
    by using a third patterning process, forming a second planarization layer on one side of the passivating-material thin film that is away from the substrate, wherein an orthographic projection of the second planarization layer on the substrate and the orthographic projection of the bonding terminals on the substrate do not overlap;
    by using a fourth patterning process, forming the light shielding layer on one side of the second planarization layer that is away from the substrate; and
    by using the second planarization layer as a mask, etching the passivating-material thin film, to form the first passivation layer.

19. The manufacturing method according to claim 18, wherein before the step of forming the light shielding layer on the one side of the second planarization layer that is away from the substrate, the method further comprises:
by using a fifth patterning process, forming a second passivation layer on one side of the second planarization layer that is away from the substrate, wherein an orthographic projection of the second passivation layer on the substrate and the orthographic projection of the bonding terminals on the substrate do not overlap; and
the step of forming the light shielding layer on the one side of the second planarization layer that is away from the substrate comprises:
forming the light shielding layer on one side of the second passivation layer that is away from the substrate.

20. The manufacturing method according to claim 16, wherein the step of forming the wiring functional layer on the one side of the substrate comprises:
forming sequentially a first metal layer, a third passivation layer, a third planarization layer, a fourth passivation layer and a second metal layer on one side of the substrate, wherein the bonding terminals further comprise a second bonding terminal and a third bonding terminal, the second bonding terminal is configured for bonding a driving chip, the driving chip is configured for driving the LED chip to emit light, the third bonding terminal is configured for bonding a flexible circuit board, the second bonding terminal is located at the active area, and the third bonding terminal is located at the peripheral area; and the metal wiring comprises a first metal wiring located at the first metal layer and a second metal wiring located at the second metal layer, the bonding terminals are located at the second metal layer and are interconnected with the second metal wiring, and the second metal wiring and the first metal wiring are connected by a via hole disposed in the insulating layer; and
the step of forming the third planarization layer comprises:
by using a sixth patterning process, forming a fourth planarization layer on one side of the third passivation layer that is away from the substrate; and
by using a seventh patterning process, forming a fifth planarization layer on one side of the fourth planarization layer that is away from the substrate, wherein the fourth planarization layer and the fifth planarization layer form the third planarization layer.

* * * * *